(12) United States Patent
Ono

(10) Patent No.: US 9,553,515 B2
(45) Date of Patent: Jan. 24, 2017

(54) BOOSTING DEVICE

(71) Applicant: Toyota Jidosha Kabushiki Kaisha, Toyota-shi Aichi-ken (JP)

(72) Inventor: Toshikazu Ono, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 212 days.

(21) Appl. No.: 14/592,344

(22) Filed: Jan. 8, 2015

(65) Prior Publication Data
US 2015/0207410 A1  Jul. 23, 2015

(30) Foreign Application Priority Data

Jan. 20, 2014  (JP) ................. 2014-008145

(51) Int. Cl.
*H02M 3/158* (2006.01)
*B60L 3/00* (2006.01)
*G01R 1/40* (2006.01)
*B60L 11/18* (2006.01)
*H02M 1/32* (2007.01)
*H02M 3/155* (2006.01)
*G01R 31/40* (2014.01)
*H02M 1/00* (2006.01)
*G01R 35/00* (2006.01)

(52) U.S. Cl.
CPC ............. *H02M 3/158* (2013.01); *B60L 3/003* (2013.01); *B60L 3/0038* (2013.01); *B60L 11/1851* (2013.01); *H02M 1/32* (2013.01); *G01R 31/40* (2013.01); *G01R 35/00* (2013.01); *H02M 2001/0009* (2013.01); *H02M 2003/1552* (2013.01)

(58) Field of Classification Search
CPC .......... H02M 3/158; H02M 1/32; B60L 3/003; B60L 3/0038; B60L 11/1851; G01R 31/40; G01R 35/00
See application file for complete search history.

(56) References Cited

U.S. PATENT DOCUMENTS

| 8,189,313 B1 * | 5/2012 | Kraft | H02H 3/08 361/93.1 |
| 8,710,810 B1 * | 4/2014 | McJimsey | H02M 3/1584 323/272 |
| 2009/0128157 A1 | 5/2009 | Moriya | |

FOREIGN PATENT DOCUMENTS

| JP | H10-253682 A | 9/1998 |
| JP | 2003-344516 A | 12/2003 |
| JP | 2004-260904 A | 9/2004 |
| JP | 2006-311635 A | 11/2006 |
| JP | 2008-178270 A | 7/2008 |
| JP | 2010-047083 A | 3/2010 |
| JP | 2011-109851 A | 6/2011 |

* cited by examiner

*Primary Examiner* — Jared Fureman
*Assistant Examiner* — Rafael Pacheco
(74) *Attorney, Agent, or Firm* — Dinsmore & Shohl LLP

(57) ABSTRACT

Proper control is performed even during a stuck abnormality of a current sensor 56 configured to detect a reactor current. A boosting converter 12 is controlled by feedback control of a boosted voltage of the boosting converter 12 and a reactor current, detected by the current sensor 56, of a reactor 54 in the boosting converter 12. When a variation of the reactor current is less than a predetermined current value, failure determination of the current sensor is performed and, if a variation of the pre-boosting voltage exceeds a predetermined voltage value, failure of the current sensor is determined.

6 Claims, 6 Drawing Sheets

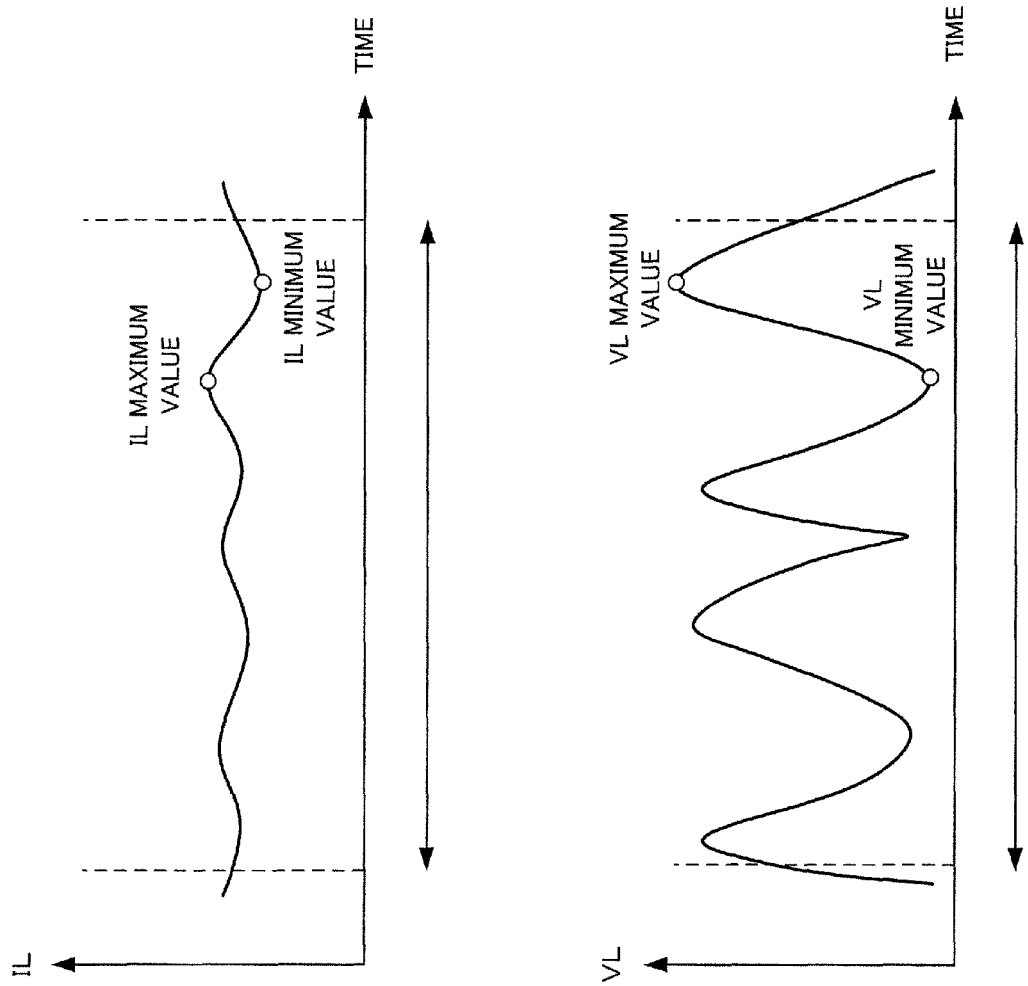

BOOSTING DEVICE

PRIORITY INFORMATION

This application claims priority to Japanese Patent Application No. 2014-008145, filed on Jan. 20, 2014, which is incorporated herein by reference in its entirety.

TECHNICAL FIELD

The present invention relates to failure determination of a current sensor that detects a reactor current of a boosting converter configured to boost the voltage of a battery.

BACKGROUND ART

Conventionally, electric vehicles (EVs) and hybrid vehicles (HVs) are driven by using motor generators powered by on-board batteries. It is more efficient to use a high power supply voltage to drive a high speed and high output motor generator. In many cases, therefore, a boosting converter is used to raise a battery voltage and supply an obtained boosted voltage to the motor generator via an inverter. Since the boosted voltage differs depending on the output torque of the motor generator, feedback control of the boosting converter is performed in order to provide a proper boosted voltage. To control the boosted voltage more properly, a reactor current that flows through a reactor in the boosting converter is measured, and feedback control is performed until the reactor current attains a target value.

SUMMARY OF THE INVENTION

In performing the feedback control of the reactor current, correct measurement of the reactor current is necessary. When a stuck abnormality (failure in which the output value sticks at a particular value) occurs in a current sensor that measures the reactor current, control performance of the boosting operation deteriorates. Specifically, when the circuit is falsely controlled according to the reactor current, the boosted voltage fluctuates, and such fluctuation of the boosted voltage also causes fluctuation of the reactor current which is generated by controlling based on the boosted voltage.

In order to solve the above-described problem, an object of the present invention is to prevent occurrence of fluctuations during control even when the stuck abnormality occurs in the current sensor that detects the reactor current.

A boosting device according to an embodiment of the present invention includes a battery, a capacitor connected in parallel with the battery to store a pre-boosting voltage, a boosting converter including a reactor connected to the capacitor and a switching element connected to the reactor and configured to obtain a boosted voltage by switching the switching element, a boosted voltage sensor configured to detect the boosted voltage, a current sensor configured to detect a reactor current flowing through the reactor, a pre-boosting voltage sensor configured to detect the pre-boosting voltage, and a control unit configured to control the boosting converter by feedback control of the boosted voltage and the reactor current. The control unit determines failure of the current sensor when a variation of the reactor current is less than a predetermined current value and a variation of the pre-boosting voltage exceeds a predetermined voltage value.

The boosting converter can be controlled in such a manner that the boosted voltage converges even when the stuck abnormality occurs in the current sensor that detects the reactor current.

BRIEF DESCRIPTION OF THE DRAWINGS

FIG. 4 illustrates a changing state of a reactor current IL;
FIG. 5 illustrates a changing state of a pre-boosting voltage VL.

DETAILED DESCRIPTION OF THE EMBODIMENT

An embodiment of the present invention will be described below by referring to the accompanying drawings. The present invention is not limited to the embodiments described below.

Figure 1:
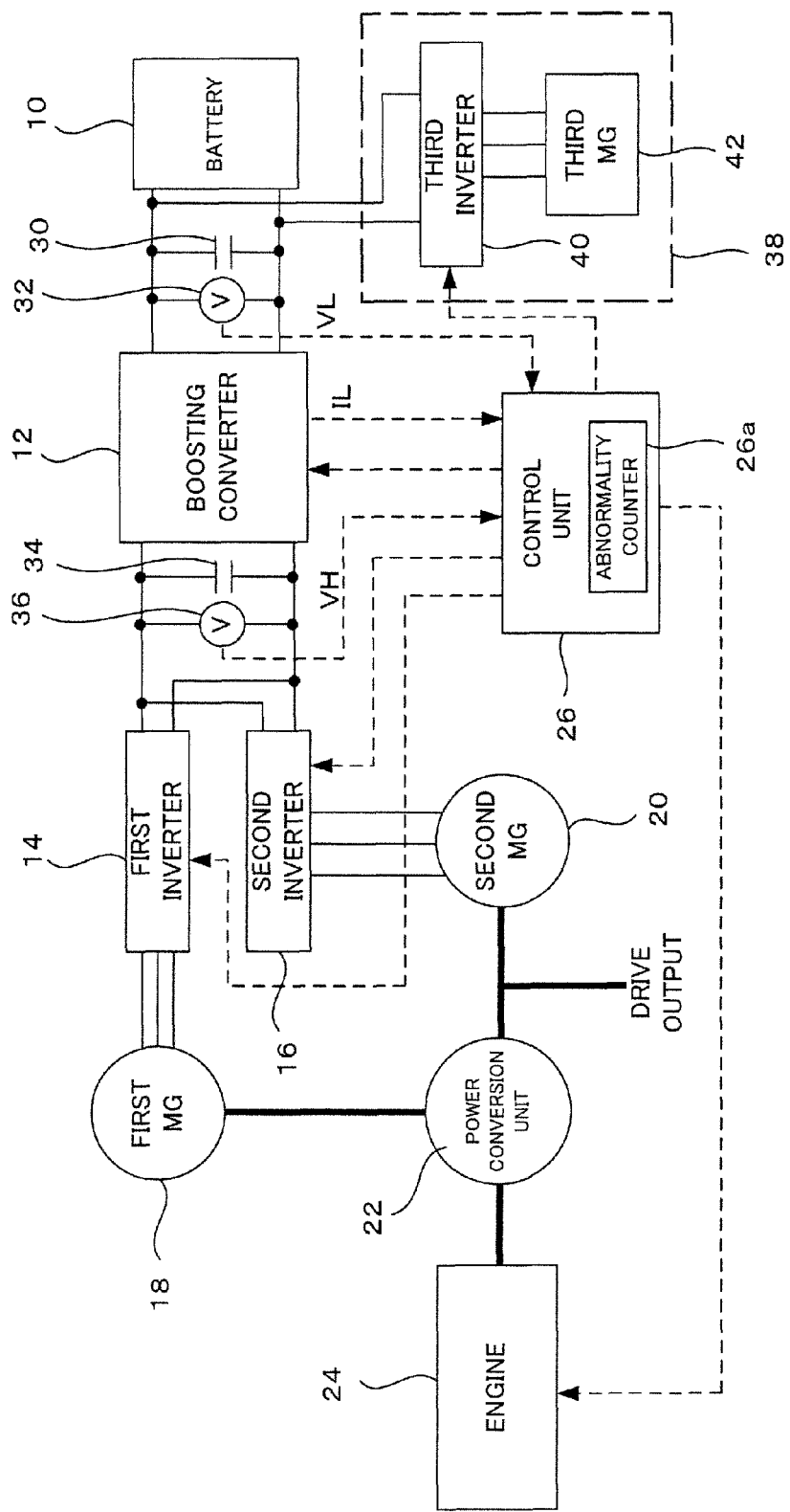
FIG. 1 is a block diagram illustrating a structure of the main part of a hybrid vehicle.

FIG. 1 is a schematic block diagram illustrating a drive system of a hybrid vehicle. A direct current (DC) output of a battery 10 is boosted by a boosting converter 12 and supplied to a first inverter 14 and a second inverter 16. The first inverter 14 is connected to a first motor generator (MG) 18 for power generation. The second inverter 16 is connected to a second motor generator (MG) 20 for driving.

Output shafts of the first MG 18 and the second MG 20 are connected to a power conversion unit 22 to which an output shaft of an engine 24 is connected as well. The rotation of the output shaft connecting the power conversion unit 22 and the second MG 20 is transmitted to the axle of a vehicle as a drive output. The output of the power conversion unit 22 and the second MG 20 are transmitted to wheels, whereby the hybrid vehicle travels.

The power conversion unit 22 is formed by, for example, a planet gear structure and controls power transmission among the first MG 18, the second MG 20, and the engine 24. The engine 24 is basically used as an output source of power, and the output of the engine 24 is transmitted to the first MG 18 via the power conversion unit 22. This causes the first MG 18 to generate power by the output of the engine 24, and the battery 10 is charged with the obtained generated power via the first inverter 14 and the boosting converter 12. The output of the engine 24 is transmitted to the drive axle via the power conversion unit 22 to cause the vehicle to travel by the output of the engine 24. In FIG. 1, the power transmission system is indicated by normal solid lines, the mechanical power transmission system is indicated by bold lines, and the signal transmission system (control system) is indicated by broken lines.

The control unit 26 controls output to the drive axle by controlling driving of the first and second inverters 14, 16, and the engine 24 according to an amount of depression of an accelerator, a target toque determined by a vehicle speed, etc. The control unit 26 also controls charging of the battery 10 by controlling driving of the engine 24 and switching of the first inverter 14 according to a state of charge (SOC) of the battery. During deceleration of speed of the vehicle, the second inverter 16 may be controlled to cause the second MG 20 to perform regenerative braking and charge the battery 10 with an obtained regenerative power. The regenerative braking may also be performed by the first MG 18.

In the present embodiment, a capacitor 30 is provided on the output side of the battery 10 to smooth its output voltage. The capacitor 30 is provided with a pre-boosting voltage sensor 32 to measure a voltage (pre-boosting voltage VL) of the capacitor 30. On the output side of the boosting converter 12, a capacitor 34 is provided to smooth the output voltage thereof, and a boosted voltage sensor 36 is provided to measure the voltage of the capacitor 34, that is, an input voltage (boosted voltage VH) of the first and second inverters 14, 16.

An electric load 38 is connected to the input side of the boosting converter 12, and driven by receiving the supply of the pre-boosting voltage VL. A third motor generator 42 is herein provided as the electric load 38 to drive the rear wheels of the vehicle, and a driving current is supplied to the third motor generator 42 via the third inverter 40. The electric load 38 driven by the pre-boosting voltage VL is formed by, for example, a DC-DC converter that supplies electric power to various devices coupled to an alternating current (AC) 100 V outlet provided in the interior of the vehicle, an on-board auxiliary machine, an auxiliary battery, etc.

Figure 2:
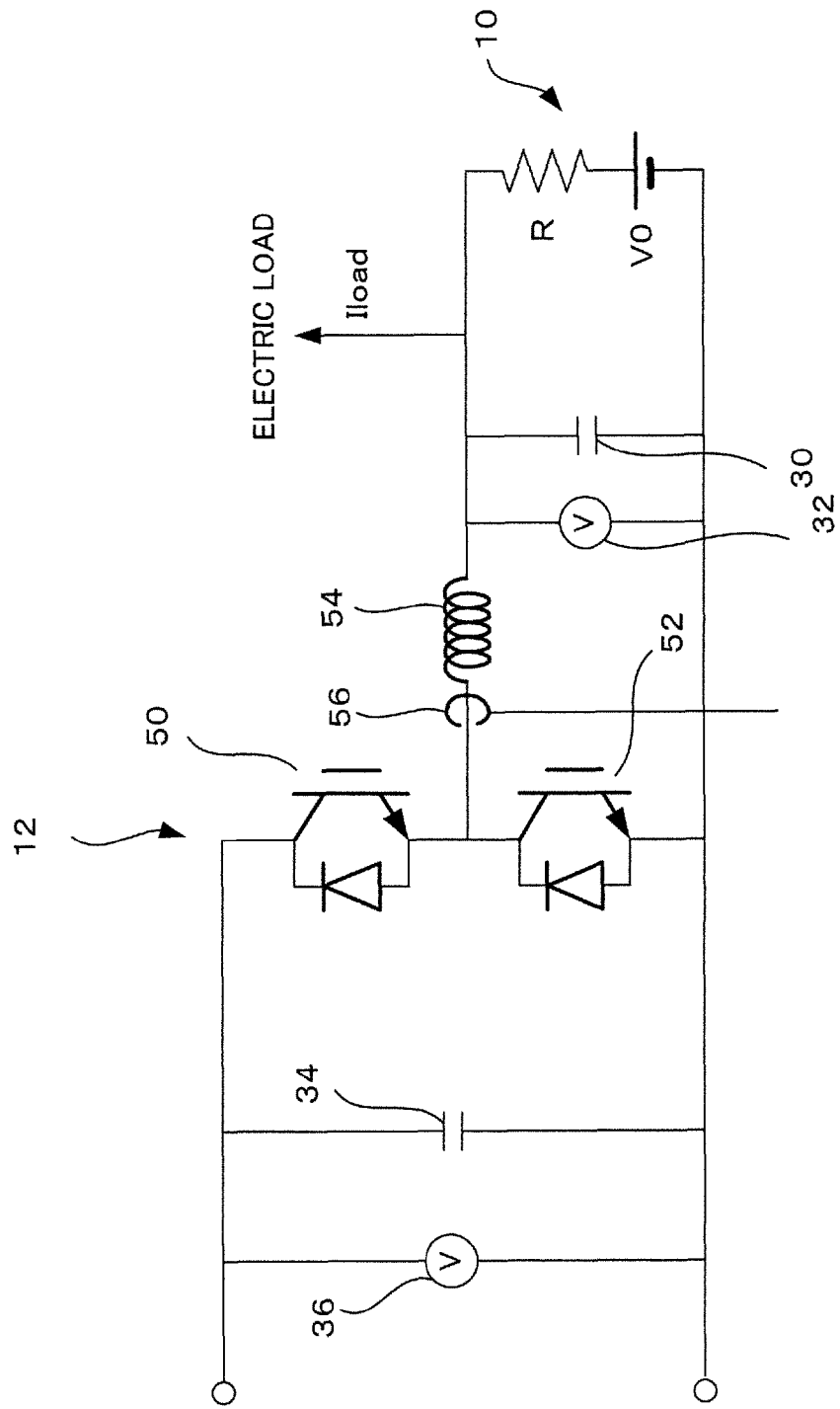
FIG. 2 illustrates a structure of a booster converter.

FIG. 2 illustrates an internal structure of the boosting converter 12. The boosting converter 12 includes two switching elements 50, 52 which are connected in series, and a reactor 54 connected to an intermediate point between the switching elements 50, 52. Each of the switching elements 50, 52 is formed by a transistor, such as an insulated gate bipolar transistor (IGBT), and a diode that allows flow of a reverse current opposite to that of the transistor.

One end of the reactor 54 is connected to a positive pole of the battery 10, and the other end of the reactor 54 is connected to the intermediate point between the switching elements 50, 52. In the switching element 50, the collector of the transistor is connected to a positive electrode bus of the first and second inverters 14, 16, and the emitter is connected to the collector of the transistor of the switching element 52. In the switching element 52, the emitter of the transistor is connected to a negative pole of the battery 10 and a negative electrode bus of the first and second inverters 14, 16.

A current sensor 56 that measures the reactor current IL flowing through the reactor 54 is also provided. Accordingly, the pre-boosting voltage VL, the boosted voltage VH, and the reactor current IL, which have been detected by the pre-boosting voltage sensor 32, the boosted voltage sensor 36, and the current sensor 56, respectively, are supplied to the control unit 26. The reactor current IL to be detected by the current sensor 56 may have an off-period current value of the switching-off period of the switching elements 50, 52 after the switching element 52 has been turned off. Accordingly, the current amount charged in the capacitor 34 via the diode of the switching element 52 can be known. A current during a voltage dropping period, the current directed to the battery 10 can be detected according to the current value while the switching element 50 is turned on.

As described above, the control unit 26 controls the first and second inverters 14, 16 and the engine 24 in such a manner that the target torque is output as the driving output and necessary generative power is obtained.

The control unit 26 further controls the switching of the switching elements 50, 52 of the boosting converter 12 so as to allow the boosted voltage VH to reach the target value. The control is basically performed by the feedback control in which the boosted voltage VH detected by the boosted voltage sensor 36 becomes identical to the target value. Meanwhile, the boosted voltage VH can be determined by the amount of current flowing through the first and second inverters 14, 16 and the reactor current mentioned above. The control unit 26 therefore controls the boosted voltage VH such that the reactor current reaches the target value as a result of to the feedback control mentioned above.

When the stuck abnormality occurs in the current sensor 56, the value is almost fixed, with the value fluctuating to some extent due to the effects of noise or the like. Upon occurrence of the stuck abnormality, the boosted voltage VH may fluctuate due to the feedback control using the reactor current. Specifically, the boosted voltage VH represents a charging voltage of the capacitor 34 for a time period in which the reactor current is integrated, and such a control is slower in speed than the control using the reactor current. When erroneous control, therefore, is performed based on the reactor current and the difference between the boosted voltage VH and the target value is equal to or more than a predetermined voltage value, the control starts to approximate the boosted voltage VH to the target value, which leads to the fluctuation of the VH. Since the boosted voltage VH is controlled to be included within the range of the predetermined voltage value, the variation value is not large.

Meanwhile, the actual reactor current IR changes significantly, and the pre-boosting voltage VL includes a voltage drop due to an internal resistance of the battery 10. Thus, the pre-boosting voltage VL fluctuates more than the boosted voltage VH as a result of variation of the actual reactor current IR.

For the pre-boosting voltage VL, an equation below is satisfied:

$$VL = V0 - R*IB = V0 - R*(Iload + IR)$$

where V0 represents an open voltage of the battery 10, IB represents an electric current flowing through the battery 10, R represents an internal resistance of the battery 10, and IR represents a reactor current.

As will be apparent from the above formula, when the current Iload supplied to the electric load 38 does not change, the pre-boosting voltage VL changes according to the change of the reactor current. When the stuck abnormality occurs in the current detection sensor 56, the change of the reactor current IR, which is the output of the current detection sensor 56, decreases.

The control unit 26 controls the reactor current IR to attain the predetermined current value and controls the boosted voltage VH to attain the predetermined voltage value, as described above, as a result of which the actual reactor current IR changes significantly.

Thus, the reactor current IR that is the detected value of the current sensor 56 does not change a lot, but the pre-boosting voltage VL changes significantly.

Figure 3:
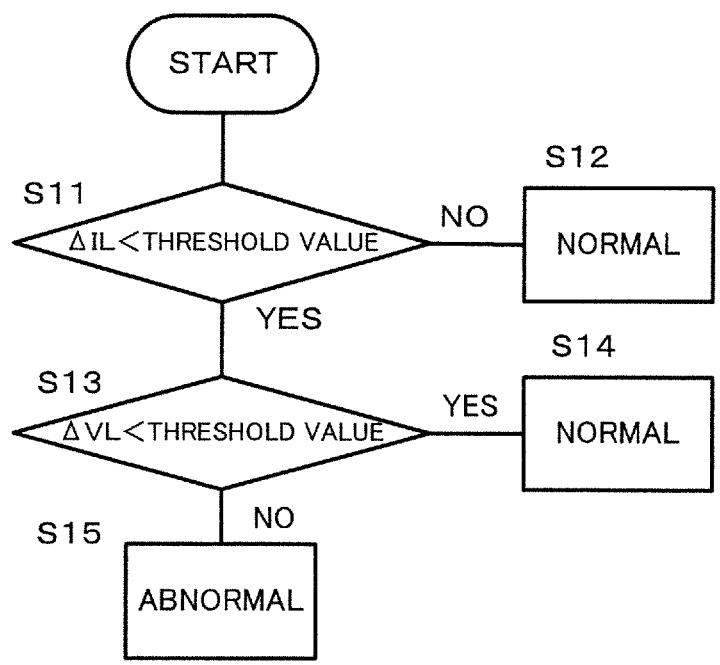
FIG. 3 is a flowchart of abnormality determination processing.

In the present embodiment, therefore, as illustrated in FIG. 3, it is determined if a variation $\Delta IL$ of the reactor current IL for a predetermined time period is less than a threshold value (a predetermined current value) (S11). If a determination result of S11 is NO, it is determined that no failure has occurred in the current sensor 56 (S12).

If the determination result of S11 is YES, it is determined whether a variation $\Delta VL$ of the pre-boosting voltage VL is less than a threshold value (a predetermined voltage value)

(S13). If a determination result is YES, it is determined that no failure has occurred in the current sensor 56 (S14).

Meanwhile, if the determination result of S13 is NO, it is determined that the failure has occurred in the current sensor 56 (S15).

FIG. 4 illustrates a changing state of the reactor current IL for a predetermined period of time (e.g., several 100 msec). In S11 of FIG. 3, the absolute value of a difference between the maximum value and the minimum value of IL, that is, ΔIL=|maximum value of IL−minimum value of IL|, is compared with the threshold value (the predetermined current value). Alternatively, it may be preferable to detect the reactor current IL only during the boosting period or dropping period to detect the change of the reactor current ΔIL during the predetermined period.

FIG. 5 illustrates the changing state of the pre-boosting voltage VL in a predetermined period of time (e.g., several 100 msec). For the pre-boosting voltage VL, the output of the pre-boosting voltage sensor 32 may be continuously detected. The absolute value of the difference between the maximum value and the minimum value of the pre-boosting voltage VL is ΔVL=|maximum value of VL−minimum value of VL|, which has been detected in S13 of FIG. 3, is compared with the threshold value (the predetermined voltage value).

Figure 6:
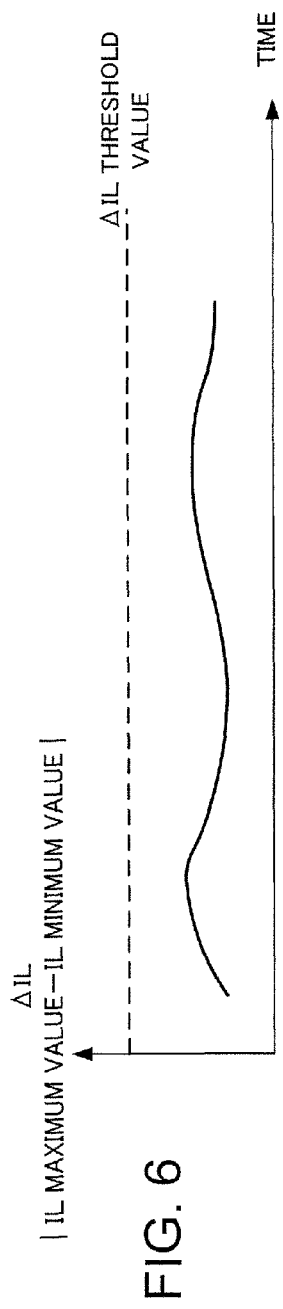
FIG. 6 illustrates a changing state of a variation ΔIL of the reactor current.

FIG. 6 illustrates the state of the reactor current IL when there is a stuck abnormality in the current sensor 56. As can be seen from the drawing, there is small change in the reactor current IL, and ΔIL is smaller than the ΔIL threshold value (the predetermined current value). ΔIL represents a change caused by various types of noise.

Figure 7:
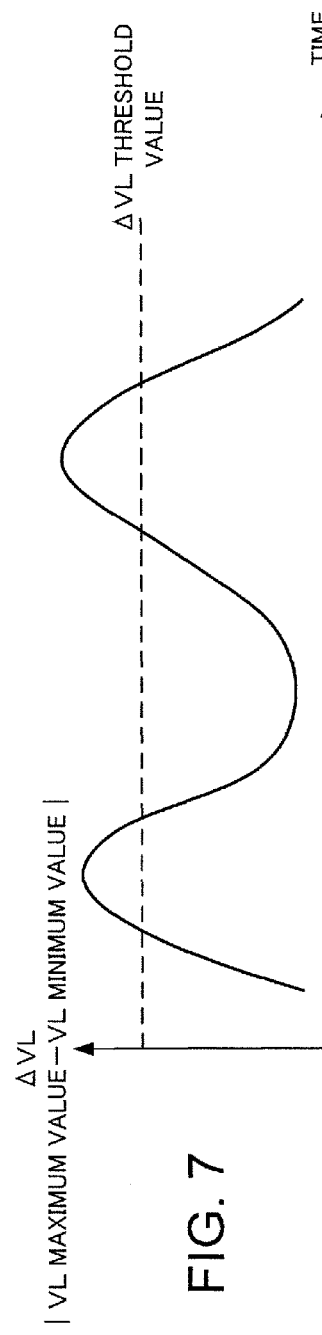
FIG. 7 illustrates the changing status of a variation ΔVL of the pre-boosting voltage.

FIG. 7 illustrates the state of the pre-boosting voltage VL when the stuck abnormality of the current sensor 56 has occurred. As illustrated in the drawing, the pre-boosting voltage VL may change significantly due to the feedback control according to the reactor current and the feedback control according to the boosted voltage VH.

Figure 8:
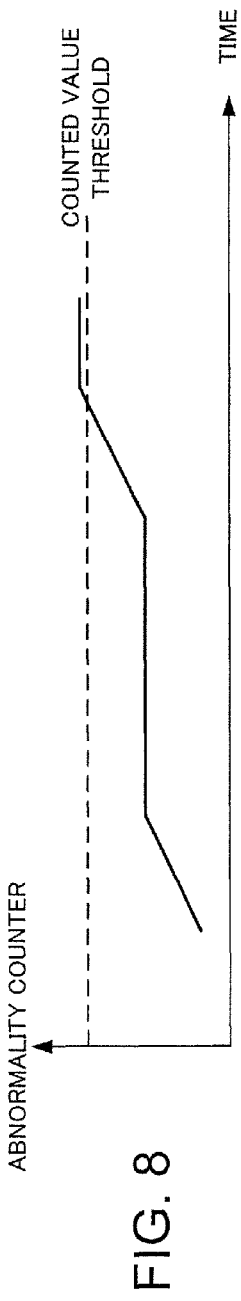
FIG. 8 illustrates a changing state of a counted value of an abnormality counter.

FIG. 8 illustrates the state of an abnormality counter 26a included in the control unit 26. The abnormality counter counts up (time) when ΔVL exceeds the threshold value (the predetermined voltage value. In S13 of FIG. 3, therefore, the abnormality is determined when the counted value of the abnormality counter 26a exceeds a threshold value of the count value (count value threshold). Accordingly, the possibility of erroneous determination of abnormality even when the current sensor 56 is not abnormal can be reduced.

As described above, the abnormality of the current sensor 56 is determined when the abnormality counter is operated to attain a counted value that is more than the predetermined value, in the case where the change ΔIL of the reactor current IL is less than the predetermined current value and the change ΔVL of the pre-boosting voltage is equal to or greater than the predetermined voltage value. Thus, an instantaneous determination of abnormality can be eliminated to guarantee proper abnormality determination.

Other Structural Example

As illustrated in FIG. 1, the electric load 38 is connected to the capacitor 30 and driven by the pre-boosting voltage VL. The electric load 38 is implemented in this manner. The electric load 38 as illustrated in FIG. 1 includes the third motor generator 42 for driving rear wheels, but may also include an air conditioner, devices connected to an AC 100V outlet in the interior of the vehicle, and a DC-DC converter that supplies power to the on-board machine and auxiliary battery, as illustrated in FIG. 2.

The electric load 38 mentioned above is driven by the pre-boosting voltage VL, and the pre-boosting voltage VL varies in accordance with the current Iload flowing through the electric load 38. Accordingly, the variation ΔVL of the pre-boosting voltage VL also varies according to the change of the current Iload flowing through the electric load 38.

In the present embodiment, as illustrated in S13 of FIG. 3, the abnormality determination is performed based on the magnitude of the variation ΔVL of the pre-boosting voltage VL. If the variation ΔVL changes according to the current flowing through the electric load 38, the determination of S13 may not be performed properly.

To perform determination of S13, therefore, it is preferable to restrict the power supply to the electric load 38. Specifically, the current flowing through the electric load 38 is restricted to such an extent that the variation ΔVL of the pre-boosting voltage VL is not affected or hardly counted in the determination of S13.

Figure 9:
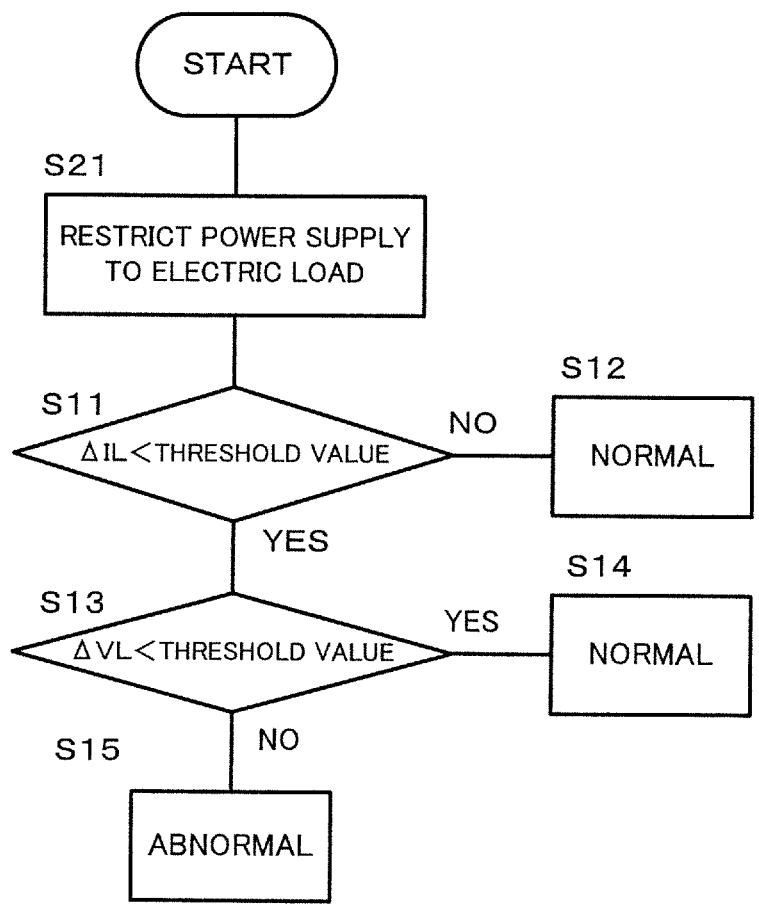
FIG. 9 is a flowchart of an alternative example of the abnormality determination processing.

As illustrated in FIG. 9, in the present embodiment, the abnormality determination is performed by restricting the power supply to the electric load 38 (S21), which minimizes the current Iload to the electric load 38 to a predetermined small value. In this state, the determination of S11 is performed and, if the determination result is YES, the process proceeds to the determination of S13. Accordingly, the abnormality determination of the current sensor 56 can be performed by restricting the effect of the electric load 38.

Since the third motor generator 42 outputs the driving force of the vehicle, it is not appropriate to control the motor generator 42 alone. Preferably, therefore, the output of the third motor generator 42 may be restricted by using the second motor generator 20 for the restricted part of the third motor generator 42. Specifically, an output ratio of the second and third motor generators 20, 42, which are on-board motor generators of the vehicle for driving, to a total target output of the second and third motor generators 20, 42 may be changed. Accordingly, the change of the pre-boosting voltage VL can be restricted while maintaining the total output. The first motor generator 18 can also bear part of the driving force, and the output of the first motor generator 18 can be included in this case. It is also preferable to decrease the output ratio of the third motor generator 42, while maintaining the total output, by even including the output of the engine 24. The output of the third motor generator 42 is preferably made zero.

Since the third motor generator 42 is for driving the rear wheels, the vehicle is driven by four wheel drive when the third motor generator 42 is used. Otherwise, the vehicle is a front driving (FF) vehicle.

Further, the third motor generator 42 preferably uses an induction motor (IM). Specifically, the third motor generator 42 is coupled with the rear wheels and rotates in accordance with the rotation of the rear wheels. When a permanent magnet (PM) is used, a counter electromotive voltage may occur as a result of the rotation of the permanent magnet. With the inductance motor, however, such a counter electromotive voltage may not occur when power supply is stopped on the stator side. There would be no problem, therefore, when the output ratio of the third motor generator 42 is changed and the driving of the third motor generator 42 is suspended.

Regarding the electric load 38 other than the third motor generator 42, it is preferable to restrict its power consumption to be not more than the predetermined value.

PARTS LIST

10: Battery
12: Boosting converter

14: First inverter
16: Second inverter
18: First motor generator
20: Second motor generator
22: Power conversion unit
24: Engine
26: Control unit
30, 34: Capacitor
32: Pre-boosting voltage sensor
36: Boosting voltage sensor
38: Electric load
40: Third inverter
42: Third motor generator
50, 52: Switching element
54: Reactor
56: Current sensor

What is claimed is:

1. A boosting device, comprising:
a battery;
a capacitor connected in parallel with the battery and configured to store a pre-boosting voltage;
a boosting converter including a reactor connected to the capacitor and a switching element connected to the reactor, and configured to obtain a boosted voltage by switching the switching element;
a boosted voltage sensor configured to detect the boosted voltage;
a current sensor configured to detect a reactor current flowing through the reactor;
a pre-boosting voltage sensor configured to detect the pre-boosting voltage; and
a control unit configured to control the boosting converter by feedback control of the boosted voltage detected by the boosted voltage sensor and the reactor current detected by the current sensor, wherein
failure of the current sensor is determined when a range of a variation of the reactor current detected by the current sensor is less than a predetermined current value and a range of a variation of the pre-boosting voltage detected by the pre-boosting voltage sensor exceeds a predetermined voltage value.

2. The boosting device according to claim 1, wherein
the control unit detects that
the variation of the reactor current is less than the predetermined current value by detecting a difference between the maximum value and the minimum value of the reactor current during a predetermined period, and comparing the detected difference with the predetermined current value, and that
the variation of the pre-boosting voltage exceeds the predetermined voltage value by detecting a difference between the maximum value and the minimum value of the pre-boosting voltage during a predetermined period, and comparing the detected difference with the predetermined voltage value.

3. The boosting device according to claim 1, wherein
an electric load configured to receive the pre-boosting voltage is connected between the battery and the boosting converter, and
power supply to the electric load is restricted while failure determination of the current sensor is performed.

4. The boosting device according to claim 2, wherein
an electric load configured to receive the pre-boosting voltage is connected between the battery and the boosting converter, and
power supply to the electric load is restricted while failure determination of the current sensor is performed.

5. The boosting device according to claim 3, wherein
the boosting device is mounted on a vehicle including a motor generator for driving front wheels and a motor generator for driving rear wheels,
the motor generator for driving front wheels is driven by receiving the boosted voltage,
the motor generator for driving rear wheels is driven by receiving the pre-boosting voltage as the electric load, and
power supply to the electric load that receives the pre-boosting voltage is restricted, while the failure determination of the current sensor is performed, by increasing an ratio of output of the motor generator for driving front wheels to output of the motor generator for driving rear wheels.

6. The boosting device according to claim 4, wherein
the boosting device is mounted on a vehicle including a motor generator for driving front wheels and a motor generator for driving rear wheels,
the motor generator for driving front wheels is driven by receiving the boosted voltage,
the motor generator for driving rear wheels is driven by receiving the pre-boosting voltage as the electric load, and
power supply to the electric load that receives the pre-boosting voltage is restricted, while the failure determination of the current sensor is performed, by increasing an ratio of output of the motor generator for driving front wheels to output of the motor generator for driving rear wheels.

* * * * *